(12) United States Patent
Deutinger et al.

(10) Patent No.: US 9,081,035 B2
(45) Date of Patent: Jul. 14, 2015

(54) TEST PROBE WITH INTEGRATED TEST TRANSFORMER

(75) Inventors: Andrea Deutinger, Pastetten (DE); Gerd Hechtfischer, Vaterstetten (DE); Christian Evers, Kirchheim (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 296 days.

(21) Appl. No.: 13/583,995

(22) PCT Filed: Jan. 20, 2011

(86) PCT No.: PCT/EP2011/000219
§ 371 (c)(1),
(2), (4) Date: Sep. 11, 2012

(87) PCT Pub. No.: WO2011/110255
PCT Pub. Date: Sep. 15, 2011

(65) Prior Publication Data
US 2013/0002284 A1   Jan. 3, 2013

(30) Foreign Application Priority Data

Mar. 11, 2010 (DE) .......................... 10 2010 011 009
May 12, 2010 (DE) .......................... 10 2010 020 296
Aug. 11, 2010 (DE) .......................... 10 2010 033 991

(51) Int. Cl.
*G01R 1/067* (2006.01)
*G01R 21/04* (2006.01)

(52) U.S. Cl.
CPC ............ *G01R 1/06772* (2013.01); *G01R 21/04* (2013.01); *G01R 1/06738* (2013.01); *G01R 1/06766* (2013.01)

(58) Field of Classification Search
CPC ........................... G01R 1/06772; G01R 21/04
USPC ............ 324/762.01, 762.03, 762.05, 754.01, 324/754.03, 754.07, 755.01–755.11
See application file for complete search history.

(56) References Cited

U.S. PATENT DOCUMENTS 5,495,173 A * 2/1996 Bockelman et al. .......... 324/625
7,307,433 B2 * 12/2007 Miller et al. ............. 324/756.03
(Continued)

FOREIGN PATENT DOCUMENTS

EP       0257833 A2     3/1988
EP       0559274 A2     9/1993
(Continued)

OTHER PUBLICATIONS

R&S® NRP-Z51 Thermal Power Sensor, Apr. 1, 2009, http://www.rohde-schwarz.de/de/Produkte/messtechnik-testsysteme/aerospace-and-defense/messtechnik/leistungs-spannungs-messer/NRP-Z51var03-%7C-4978.html.*
(Continued)

*Primary Examiner* — Patrick Assouad
*Assistant Examiner* — Demetrius Pretlow
(74) *Attorney, Agent, or Firm* — Ditthavong & Steiner, P.C.

(57) ABSTRACT

A measuring device used for registering a test signal originating from a circuit structure applied to a wafer. The measuring device provides at least one test probe and at least one test transformer. The at least one test transformer is connected to the at least one test probe in an electrically conductive manner. In this context, the test transformer is arranged on the test probe.

18 Claims, 6 Drawing Sheets

(56) References Cited

U.S. PATENT DOCUMENTS

| | | | |
|---|---|---|---|
| 8,638,114 B2* | 1/2014 | Josefosky et al. | 324/755.09 |
| 2004/0057495 A1 | 3/2004 | Lee et al. | |
| 2005/0253603 A1* | 11/2005 | Capps et al. | 324/754 |
| 2007/0262782 A1* | 11/2007 | Hartmann | 324/754 |
| 2007/0285085 A1 | 12/2007 | Strid et al. | |
| 2008/0042668 A1* | 2/2008 | Eldridge et al. | 324/754 |
| 2008/0252298 A1 | 10/2008 | Noujeim | |
| 2009/0021277 A1* | 1/2009 | Namburi et al. | 324/762 |
| 2009/0189620 A1* | 7/2009 | Audette et al. | 324/754 |
| 2009/0189621 A1* | 7/2009 | Kolmhofer | 324/754 |
| 2010/0164518 A1* | 7/2010 | Yamada et al. | 324/754 |
| 2010/0176831 A1* | 7/2010 | Palcisko et al. | 324/757 |

FOREIGN PATENT DOCUMENTS

| | | |
|---|---|---|
| EP | 0624801 A1 | 11/1994 |
| EP | 1004883 A1 | 5/2000 |
| GB | 2298518 A | 9/1996 |
| WO | WO 00/79293 A1 | 12/2000 |
| WO | WO 2006/066676 A1 | 6/2006 |

OTHER PUBLICATIONS

Drouin et al., "An MHMIC K-Band Direct Conversion Demodulator in CPW", conference publication, Oct. 2003, vol. 1, pp. 139-142, Microwave Conference, 2003. 33rd European.

International Search Report, International Application No. PCT/EP2011/000219, Sep. 6, 2011.

Kertis et al., "A 20 GS/s 5-Bit SiGe BiCMOS Dual-Nyquist Flash ADC With Sampling Capability up to 35 GS/s Featuring Offset Corrected Exclusive-Or Comparators", IEEE Journal of Solid-State Circuits, vol. 44. No. 9, Sep. 2009, pp. 2295-2311

Shakouri et al., "500 GHZ MMIC Sampling Wafer Probe", electronic letters, vol. 29, No. 6, Mar. 1993, pp. 557-558, IEEE Stevenage, GB.

Yu et al., "Full Two-Port On-Wafer Vector Network Ananlysis to 120 GHZ Using Active Probes", Microwave Symposium Digest, 1993, pp. 1339-1342.

Yu et al., "Millimeter-Wave On-Wafer Waveform and Network Measurements Using Active Probes", Apr. 1995, pp. 721-729 vol. 43, No. 4, part 1, IEEE Transactions on Microwave Theory and Techniques, New York, US.

English Translation of International Preliminary Report on Patentability for PCT/EP2011/000219, pp. 1-8.

* cited by examiner

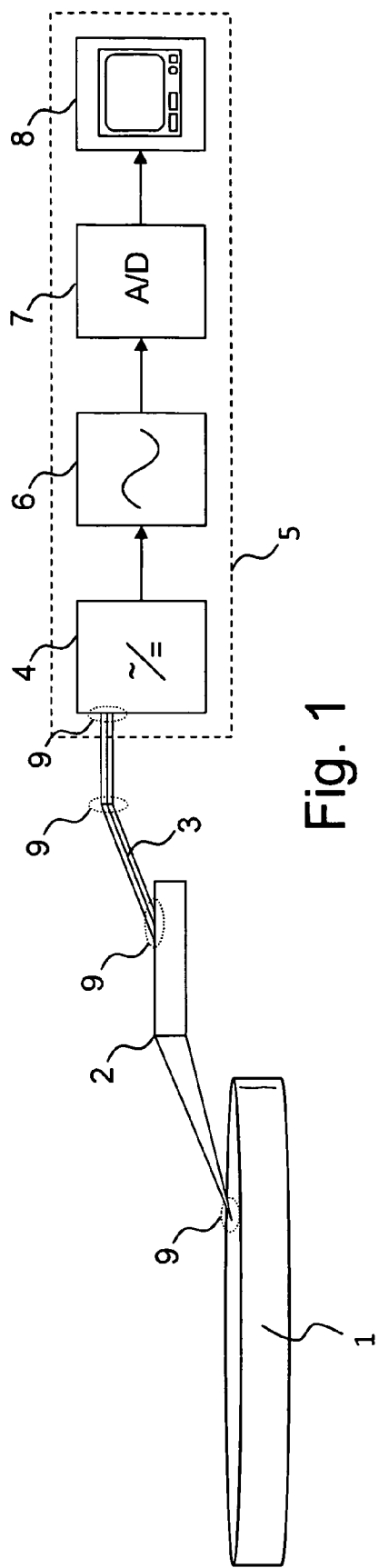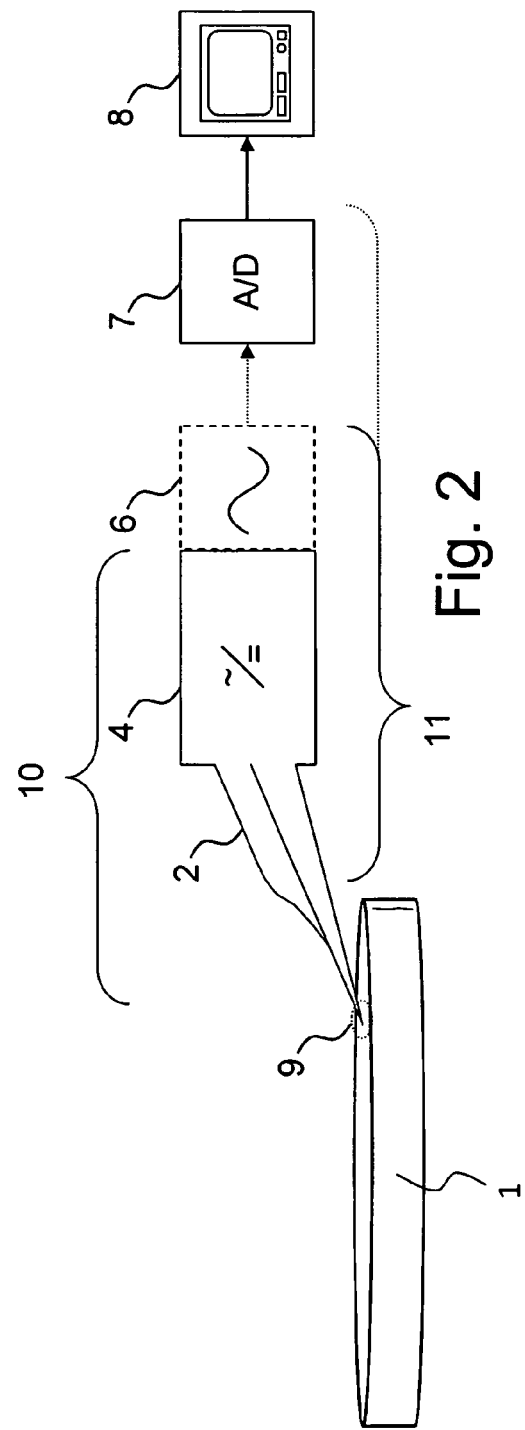

TEST PROBE WITH INTEGRATED TEST TRANSFORMER

CROSS-REFERENCE TO RELATED APPLICATION

The present application is a national phase application of PCT Application No. PCT/EP2011/000219, filed on Jan. 20, 2011, and claims priority to German Application No. DE 10 2010 011 009.4, filed on Mar. 11, 2010, German Application No. DE 10 2010 020 296.7, filed on May 12, 2010, and German Application No. DE 10 2010 033 991.1, filed on Aug. 11, 2010, the entire contents of which are herein incorporated by reference.

BACKGROUND OF THE INVENTION

1. Field of the Invention

The present invention relates to a measuring device for registering a test signal from a circuit structure applied to a wafer (circuit carrier, for example, made from a semiconductor material).

2. Discussion of the Background

During the course of manufacturing integrated circuits, such as amplifier circuits, of which a plurality are disposed on a wafer, it is important to be able to determine as quickly as possible which of these integrated circuits are functional. Progressively smaller circuit structures have led to increased failure rates during the production process. If the functioning of the integrated circuits were only to be checked after they had been integrated in their housing, this would lead to unnecessary costs for the required production steps. To achieve savings in production costs, the functioning of the integrated circuits is checked even before they are separated from the wafer. For this purpose, each integrated circuit contains small test terminals, so-called pads, to which test signals can be applied and measured. These test terminals are subsequently used for the attachment of bonding wires. Special wafer-measuring devices (English: wafer-probers) which provide very small test probes and can be adjusted very accurately in their spatial positioning are required for these measurements.

A device for checking the functioning of individual circuit structures applied to a wafer is known from WO 00/79293 A1. In this context, the wafer to be checked is clamped to a height-adjustable support and pressed against needles mounted in an elastic manner. The needles themselves are connected to a test printed-circuit board. In this context, the test printed-circuit board is connected to the sensor head via an elastic connection. The test printed-circuit board is supplied with current and test signals via the sensor head and reroutes the received test signals to the latter.

The disadvantage with WO 00/79293 A1 is that the device is only suitable for measuring low-frequency signals. However, if the signal power of integrated high-frequency amplifier circuits is to be measured, the device described is associated with various disadvantages. Because the high-frequency test signal is only evaluated within the sensor head, reflections which falsify the test signal arise at various intermediate positions. This is attributable to the long line distance which, under some circumstances in the case of a high-frequency test signal, can be several wavelengths long. Such positions are, for example, the transition from the needle to the test printed-circuit board or from the test printed-circuit board via the elastic connection to the sensor head in which the signal evaluation is disposed, so that a high-frequency test signal can no longer be securely registered with this device.

SUMMARY OF THE INVENTION

Embodiments of the invention therefore provide a measuring device with which the registration of the power or the signal characteristic of a broadband high-frequency test signal is possible.

Embodiments of the measuring device according to the invention are used for registering a test signal from a circuit structure applied to a wafer. In this context, embodiments of the measuring device according to the invention provides at least one test probe and at least one test transformer. Accordingly, the at least one test transformer is connected in an electrically conductive manner to the at least one test probe. According to embodiments of the invention, the test transformer is therefore arranged on the test probe.

It is particularly advantageous if the test transformer is arranged on the test probe. As a result, no reflections, such as would be caused, for example, by cable transitions, occur between the test probe and the test transformer. The measurement becomes considerably more precise and is also suitable for high-frequencies.

It is particularly advantageous if the test probe and the test transformer can be withdrawn jointly from the measuring device. On the one hand, the test probe can then be replaced rapidly and, on the other hand, a recalibration is not necessary in this case, because the test transformer is also replaced. The new test probe and the new test transformer have already been calibrated during the manufacturing process, so that after the replacement of the test probe, further measurements can be continued directly.

A further advantage is achieved if the test transformer is arranged directly adjacent to the test probe and/or that the test transformer is connected directly to the test probe, and the test transformer and/or the test probe form a test unit. Because both the test transformer and also the test probe are connected to one another in an inseparable manner, no further reflection sites can occur, for example, through the replacement of a connection between test probe and test transformer. This allows the entire test unit to be calibrated even during the manufacturing process. A further calibration during the course of operation is no longer necessary, thereby avoiding unnecessary additional costs and at the same time permanently increasing the accuracy of the measurement.

Moreover, it is advantageous if the test transformer is a thermal power sensor. By contrast with a power sensor which is built up from diodes, with the use of a thermal power sensor, the power of a test signal can be registered accurately, averaged over time, with any kind of modulation. Moreover, thermal power sensors respond significantly better to harmonics of the test signal.

Finally, it is advantageous if the measuring device according to the invention provides a balancing device and that the balancing device provides a signal conditioning and/or an analog/digital (A/D) converter. This allows short signal paths for the analog test signal and ultimately a compact arrangement of the measuring device as a whole.

BRIEF DESCRIPTION OF THE DRAWINGS

Various exemplary embodiments of the invention are described by way of example below with reference to the drawings. The same subject matters are shown with the same reference numbers. In detail, the corresponding Figures in the drawings are as follows:

FIG. 1 shows an overview of a block-circuit diagram of a hitherto conventional wafer-measuring device;

FIG. 2 shows an overview of a block-circuit diagram of an exemplary embodiment of the measuring device according to the invention;

DETAILED DESCRIPTION OF EXEMPLARY EMBODIMENTS OF THE INVENTION

Figure 3A:
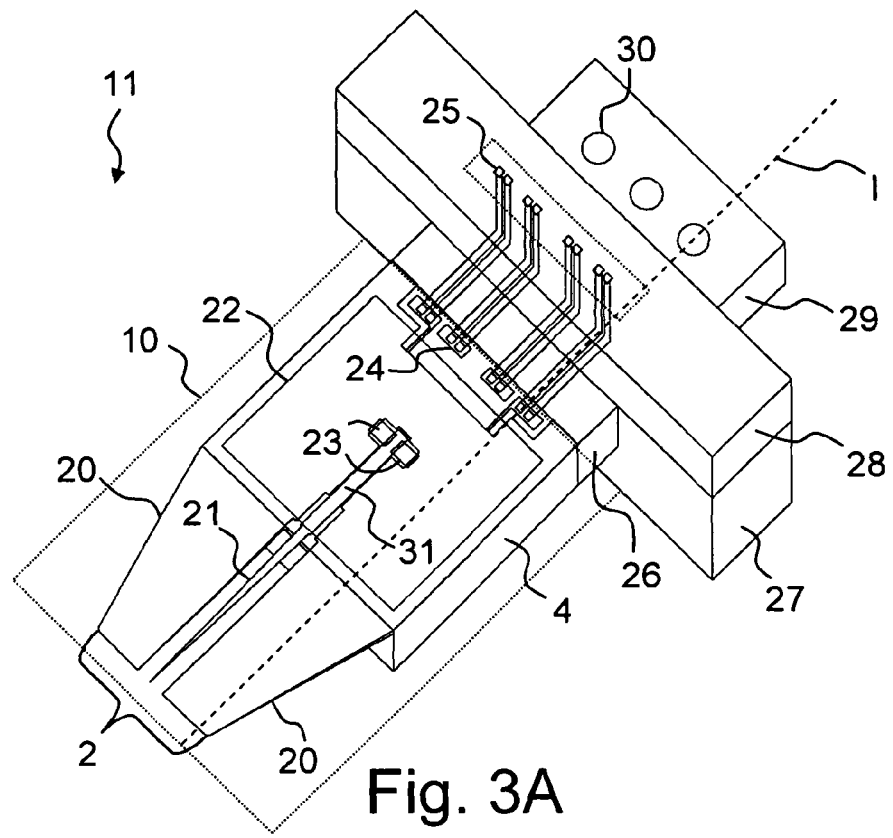
FIG. 3A shows a spatial view of an exemplary embodiment of the measuring device according to the invention.

FIG. 1 shows a hitherto conventional wafer-measuring device (wafer prober). Circuit structures of integrated circuits, such as amplifier circuits, are applied to a wafer (circuit carrier) 1. One end of the test probe 2 is connected in a conductive manner to the circuit structures on the wafer 1. In this context, the one end contacts the terminal regions of the individual circuit structures on the wafer 2, which will subsequently be connected to the bonding wires. The test probe 2 is connected to the test transformer 4 of the sensor head 5 via the cable connection 3. The cable connection 3 can be a coaxial cable connection 3 or a hollow conductor connection 3. The test transformer 4 is connected to an analog signal-processing unit 6, which conditions the analog test signal for digital signal processing in the digital signal-processing unit 7. Alongside an analog/digital converter, the digital signal-processing unit 7 provides a digital signal processor, which evaluates the test data and transmits them to an output port 8. This output port 8 can be, for example, a USB port (universal serial bus).

Since the entire measurement electronics are integrated in the sensor head 5 and accordingly at a distance from the test probe 2, the length of the lines from the surface of the wafer 1 to the input of the test transformer 4 can, under some circumstances, be up to several wavelengths, dependent upon the frequency of the high-frequency test signal. This leads to undesired reflections 9 and a reduction in the strength of the test-signal registration. Reflections 9 occur, for example, at positions, at which the impedance of the line changes. This can be at the transition between the wafer 1 and the test probe 2, or at the transition between the test probe 2 and the cable connection 3, or respectively within the cable connection 3, or at the transition between the cable connection 3 and the test transformer 4. In this context, the reflections 9 and the reductions in signal strength are dependent upon the frequency of the test signal.

The reflections 9 and reductions in signal strength can, in fact, be taken into consideration in the test data collected; however, this presupposes an accurate characterization of the transmission parameters of the test probe 2 up to the test transformer 4. With regard to the fact that the test probe 2 is subjected to increased wear, the entire wafer-measuring device must be recalibrated every time the test probe 2 is replaced. On the one hand, this is time consuming and, on the other hand, the presence of further test equipment is necessarily presupposed.

The disadvantages described can be avoided if the test probe 2 and the test transformer 4 are integrated together in a test unit 10. FIG. 2 shows an overview in this respect of an exemplary embodiment of the measuring device according to the invention. The wafer 1 is connected in a conductive manner to the test probe 2. The test transformer 4 is arranged directly adjacent to the test probe 2, so that no reflections 9 and reductions in signal strength occur between the test probe 9 and the test transformer 4. Similarly, the analog signal-processing unit 6 and optionally a part of the digital signal-processing unit 7 can be disposed in the proximity of the test unit 10. Possible embodiments are described in detail in the subsequent drawings.

Reflections 9 occur, if at all, only at the transition between the surface of the wafer 1 and the test probe 2. Further reflection sites have disappeared or have already been taken into consideration. Precisely the one-piece, inseparable embodiment between the test probe 2 and the test transformer 4 means that the test unit 10 can be characterized in full with regard to its transmission parameters, even in the manufacturing process. In the event of wear on the test probe 2, the entire test unit 10 is removed and replaced with a new test unit 10. The necessary calibration data for the new test unit 10 are contained within the latter on a data medium and can be loaded into the digital signal-processing unit 7. Ultimately, in the event of a change of the test probe 2, there is no further requirement to recalibrate the entire measuring device 11 or to keep the test equipment necessary for this.

FIG. 3A shows a spatial view of a possible exemplary embodiment of the measuring device 11 according to the invention. The measuring device 11 according to the invention provides at least one test probe 2 and at least one test transformer 4, wherein the at least one test transformer 4 is connected in an electrically conductive manner to the at least one test probe 2. As shown in FIG. 3A, the test transformer 4 is connected immediately and/or directly to the test probe 2 in an inseparable manner. Test probe 2 and test transformer 4 either form a test unit 10 or they are integrated within a test unit 10.

The test probe 2 provides at least one test-signal contact 21 and at least one ground contact 20, which are embodied as independent probes 20, 21. A test signal is supplied via the test-signal contact 21 to the test probe 2 and therefore to the test unit 10. In particular, this test signal is a high-frequency test signal. In this context, the probes 20 for the ground contact 20 are significantly wider than the probe 21 for the test-signal contact. The width of the probe 21 for the test-signal contact 21 is, for example, approximately 20 µm. The individual probes 20, 21 of the test probe 2 are embodied to be so thin that they can easily be bent when pressed against a terminal region of the wafer 1, thereby establishing a readily elastic connection between the wafer 1 and the test transformer 4.

The test transformer 4 is preferably a thermal power sensor. Dependent upon the power of the test signal, which is supplied to the latter via the test probe 2, this generates an analog, direct-voltage output signal, which is proportional to the power of the test signal. A thermal power sensor is more accurate than a power measurement with diodes and in this context averages every kind of modulation and is insensitive to harmonics of the test signal. The test signal is supplied from the test probe 2 via a stripline 31 or a coplanar line 31 to two heating resistors 23 and drained across these to the reference ground.

The heating resistors 23 are accordingly heated, wherein the radiated thermal energy ensures that a thermo-voltage occurs in the thermoelements 80 attached in the immediate surroundings. The thermoelements 80 are arranged, for example, in a layer above the heating resistors 23 in the region 22. Furthermore, the test transformer 4 provides further connecting terminals 24, at which a direct-voltage signal proportional to the power of the test signal can be picked up. Moreover, a signal, which is drained to the reference ground via a third heating resistor, which is not illustrated, can also be supplied via these connecting terminals 24. All of the heating resistors 23 are directly thermally connected to one another. The accuracy can be increased if a known signal is supplied via the third heating resistor.

The measuring device 11 also provides a connecting element 26, which is connected directly or indirectly to the test transformer 4. The connection can be, for example, an adhesive connection and/or a clamp connection. The connecting element 26 preferably comprises gold or brass or another material with good thermal conductivity.

Furthermore, the measuring device 11 provides a balancing device 27 which is connected to the connecting element 26. The balancing device 27 provides a terminal plug 28, wherein the terminal plug 28 provides additional terminal bushes 25. The balancing device 27 can be connected via the terminal bushes 25 to a holding device, which is not illustrated. This holding device provides a plug, which engages in the terminal bushes 25 and secures the data transmission and energy supply of the measuring device 11.

Moreover, sufficient space is available in the balancing device 27 so that the analog signal-processing unit 6 and/or an analog/digital (A/D) converter can be integrated within the latter. A digital signal processor is integrated in the holding device, which is not illustrated, and communicates with the A/D converter.

The balancing device 27 is made from a material with good thermal conductivity, for example, gold or brass. The test transformer 4 is connected in a thermally conductive manner via the connecting element 26, which also provides very good thermal conductivity, for example, via a thermal resistor of fixed definition, to a heat sink, for example, in the form of the balancing element 27. The functioning of the test transformer 4 can only be guaranteed in this manner.

Moreover, the measuring device 11 provides a retaining element 29, which is mechanically connected in a rigid manner to the balancing element 27. The retaining element 29 provides several boreholes 30, which connect the retaining element 29 rigidly to the holding device, which is not illustrated. In this context, the holding device provides a further plug connection, which engages in the boreholes 30. Of course, the retaining element 29 can also provide a plug connection, which further engages in boreholes of the holding device, which is not illustrated. By way of support, the surface of the retaining element 29 and/or the surface of the holding device, which is not illustrated, can be magnetic, in order to ensure a safe attachment of the measuring device 11 on the holding device, which is not illustrated.

In one exemplary embodiment according to the invention, which is not illustrated, the measuring device 11 is connected to the holding device in an elastic manner. This can be achieved, for example, by an elastic plug connection, which engages in the boreholes 30 of the retaining element 29. In this case, the data transmission to the terminal bushes 25 can take place via a flexible foil cable.

Figure 3B:
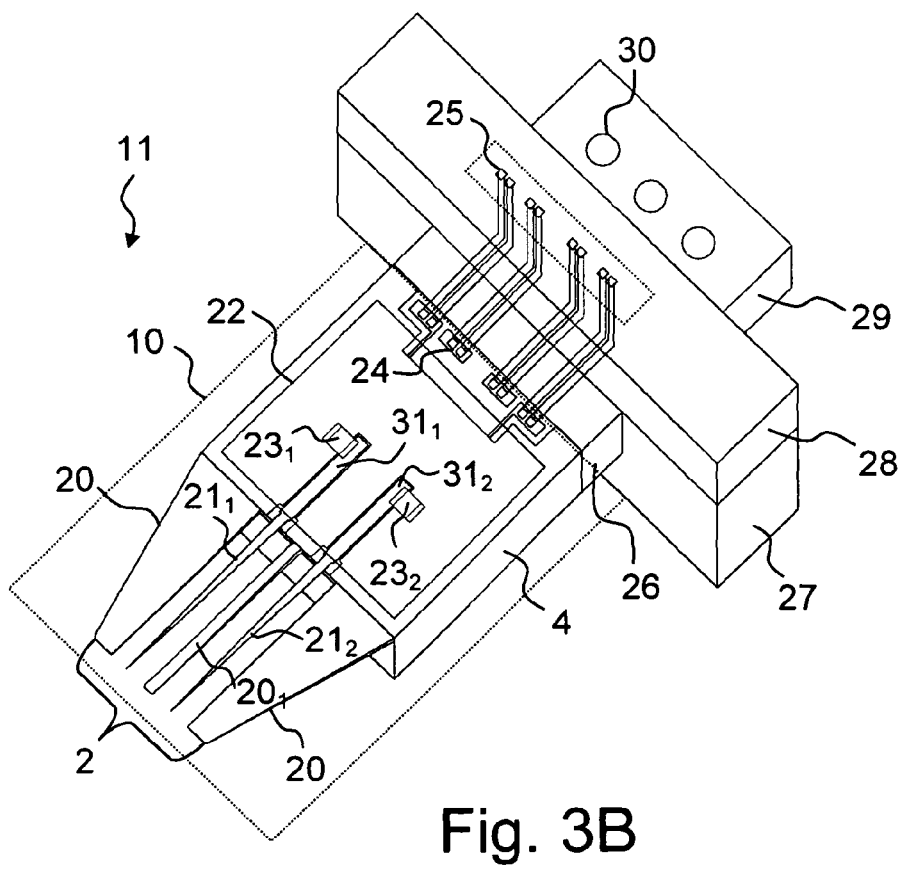
FIG. 3B shows a spatial view of a further exemplary embodiment of the measuring device according to the invention.

FIG. 3B shows a spatial view of a further possible exemplary embodiment of the measuring device 11 according to the invention. The measuring device according to the invention is structured in a substantially similar manner to the exemplary embodiment according to the invention from FIG. 3A, for which reason reference is made to the relevant description. However, the exemplary embodiment according to the invention shown in FIG. 3B provides two test-signal contacts $21_1$, $21_2$ and a further ground contact $20_1$. The test-signal contact $21_1$ is connected in an electrically conductive manner via the strip line $31_1$ to the heating resistor $23_1$. The test-signal contact $21_2$ is connected in an electrically conductive manner via the strip line $31_2$ to the heating resistor $23_2$. By contrast with the exemplary embodiment from FIG. 3A, the powers of two different signals can be registered at the same time by means of the two test-signal contacts $21_1$, $21_2$. In order to avoid a mutual influence, the two heating resistors $23_1$, $23_2$ are disposed spatially further away from one another than is illustrated in the exemplary embodiment in FIG. 3A. In order to reduce ground loops and to minimise the mutual influence of the test signals on the individual test-signal contacts $21_1$, $21_2$, a further ground contact $20_1$ is formed between the individual test-signal contacts $21_1$, $21_2$. However, this further ground contact $20_1$ is not quite as wide as the ground contact 20 already present. By preference, the test probe 2 here comprises respectively a ground contact 20 at the edge and a further ground contact $20_1$ in the middle, between which the test-signal contacts $21_1$, $21_2$ are formed. In this context, the following signal sequence occurs: ground-signal 1-ground-signal 2-ground (English: ground-signal-ground-signal-ground).

Figure 3C:
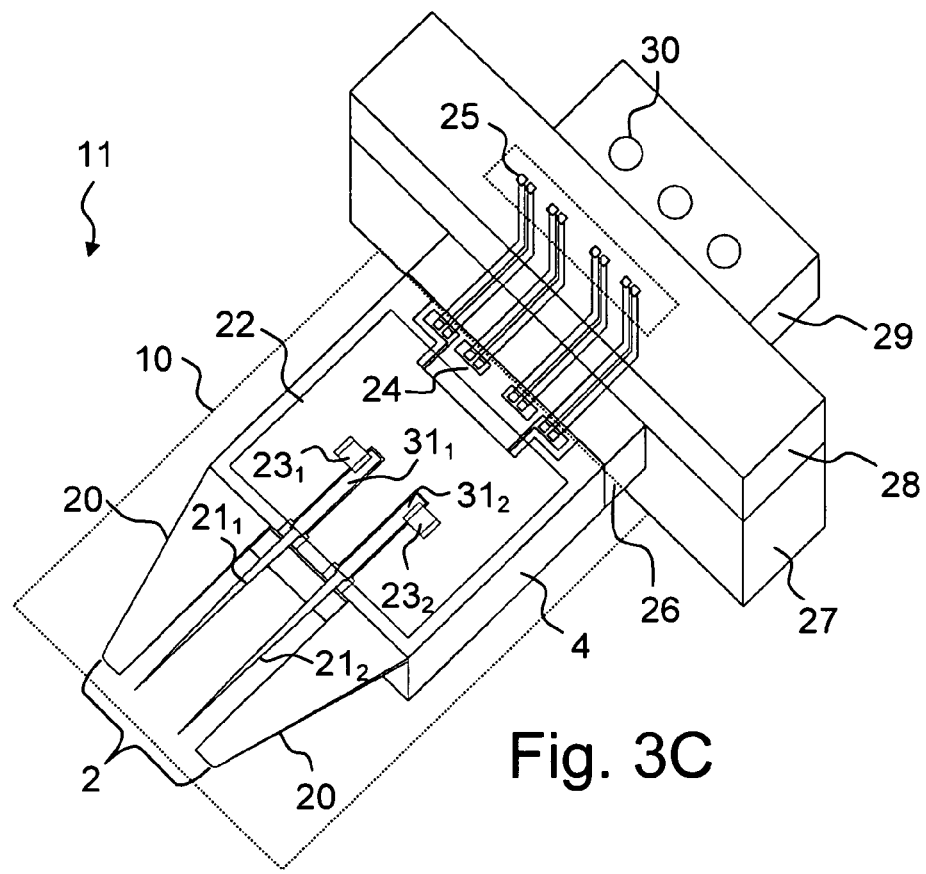
FIG. 3C shows a spatial view of a further exemplary embodiment of the measuring device according to the invention.

FIG. 3C shows a spatial view of a further possible exemplary embodiment of the measuring device 11 according to the invention. The measuring device 11 according to the invention is structured in a substantially similar manner to the exemplary embodiment according to the invention shown in FIG. 3B, for which reason reference is made here to the relevant description. The only difference is that the further ground contact $20_1$ is not present, and the structure can therefore be implemented more simply.

Figure 3D:
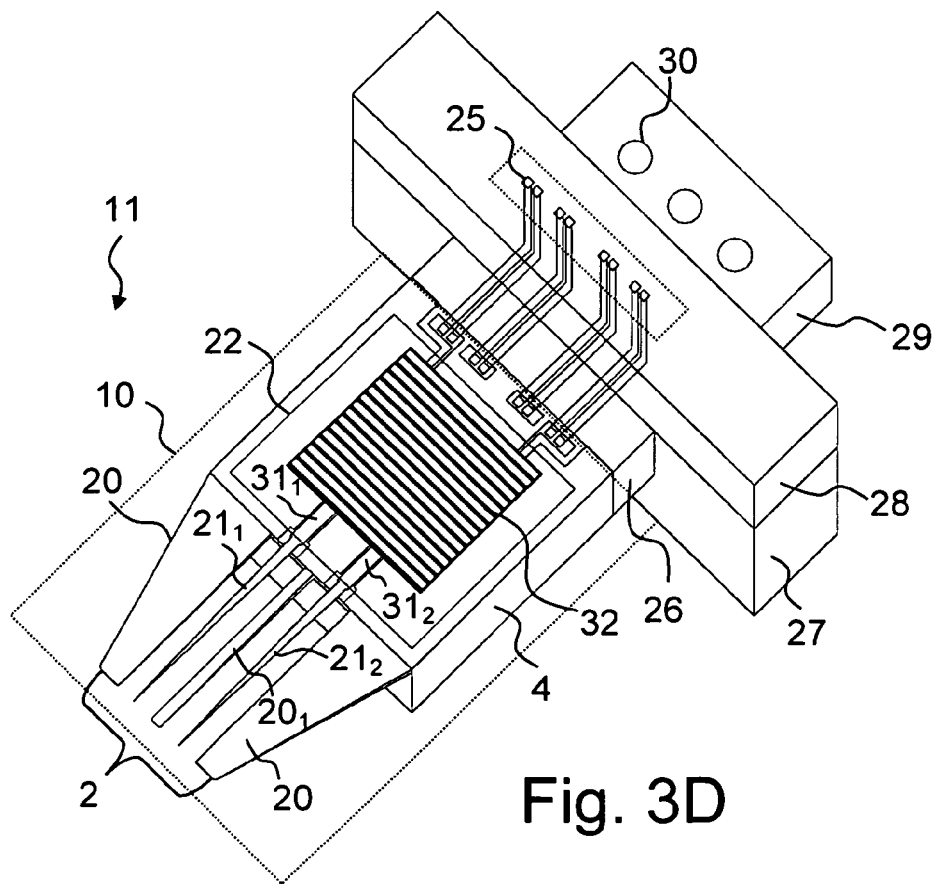
FIG. 3D shows a spatial view of a further exemplary embodiment of the measuring device according to the invention.

FIG. 3D shows a spatial view of a further possible exemplary embodiment of the measuring device 11 according to the invention. The structure of the test probe 2 corresponds to that from the description for FIG. 3B. By way of difference, the test transformer 4 is no longer a thermal power sensor. Instead, the test transformer 4 contains an I/Q demodulator (inphase/quadrature) and/or an analog/digital converter. Accordingly, it is possible to investigate, for example, amplifier circuits which amplify a digitally modulated signal. At the output of the inphase/quadrature demodulator, of which the chip structure 32 is shown in FIG. 3D, the inphase and the quadrature component are output directly. For example, the EVM (error vector magnitude) of an amplifier circuit can be measured in this manner, so that faulty amplifier circuits can be identified even before they are separated from the wafer. Instead of the inphase/quadrature demodulator, the chip structure 32 can also be an analog/digital converter with which the signal characteristic of the test signal can be registered. In view of the two test-signal contacts 21₁, 21₂, either the test signal can be registered in a differential manner, or two different signals can be measured relative to the reference ground. In this context, the type of measurement can be changed at any time. In order to protect the chip structure 32 from environmental influence, the test transformer 4 must also be packed in an airtight housing 65. Of course, it is possible to dispense with the additional ground contact 20₂ dependent upon the application.

Figure 4:
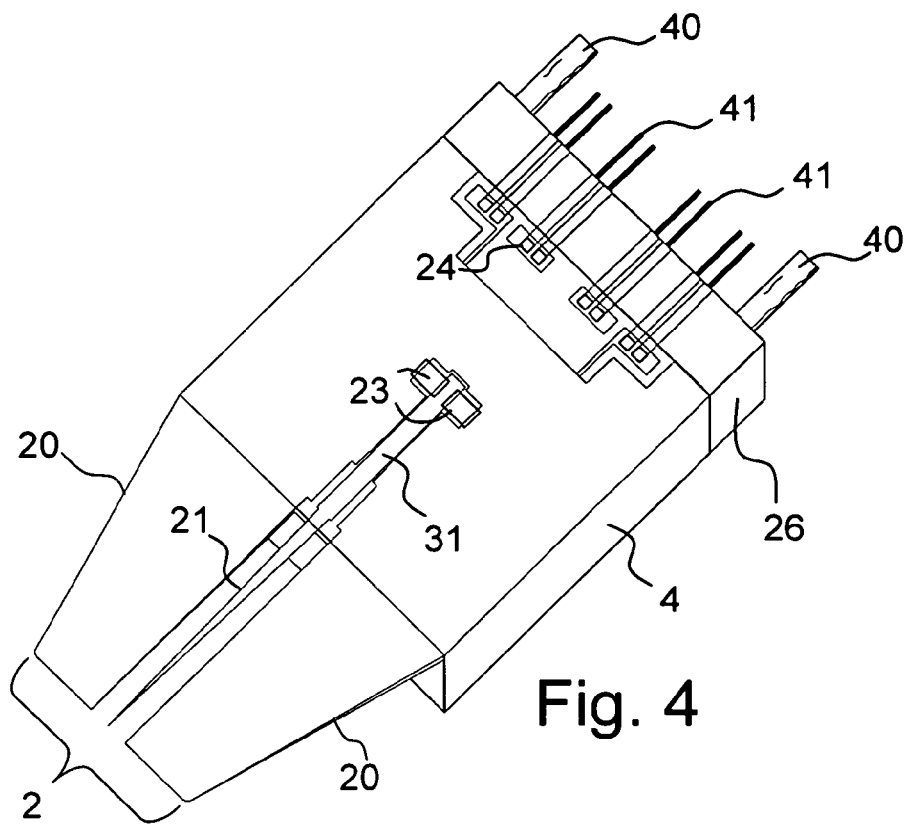
FIG. 4 shows a spatial view of an exemplary embodiment of a part of the measuring device according to the invention which contains a plug connection.

FIG. 4 shows a spatial view of a possible exemplary embodiment of a part of the measuring device 11 according to the invention. The test unit 10 and a connecting element 26 are illustrated, as already described in FIG. 3A, to which reference is made here. Furthermore, the connecting element 26 provides another plug connection. The plug connection provides plugs 40 for mechanical attachment and several contact plugs 41 for the transmission of various signals. Of course, these can also be bushes, so that the plug itself can be embodied in the balancing device 27.

The test probe 2 and the test transformer 4 can be jointly replaced in a very simple manner by withdrawing from the measuring device 11. This is achieved in that the test probe 2, the test transformer 4 and the connecting element 26 form a unit, which can be detached from holding elements, such as, for example, the balancing device 27. As a result, it is possible to replace a defective test probe 2 as simply and cost-favourably as possible. In this context, it is particularly advantageous that both the test probe 2 and also the test transformer 4 are replaced with a new test probe 2 and a new test transformer 4. These new components have already been tested in full during manufacture, so that a further recalibration is not necessary. The calibration data only have to be loaded into the digital signal-processing unit 7.

Figure 5:
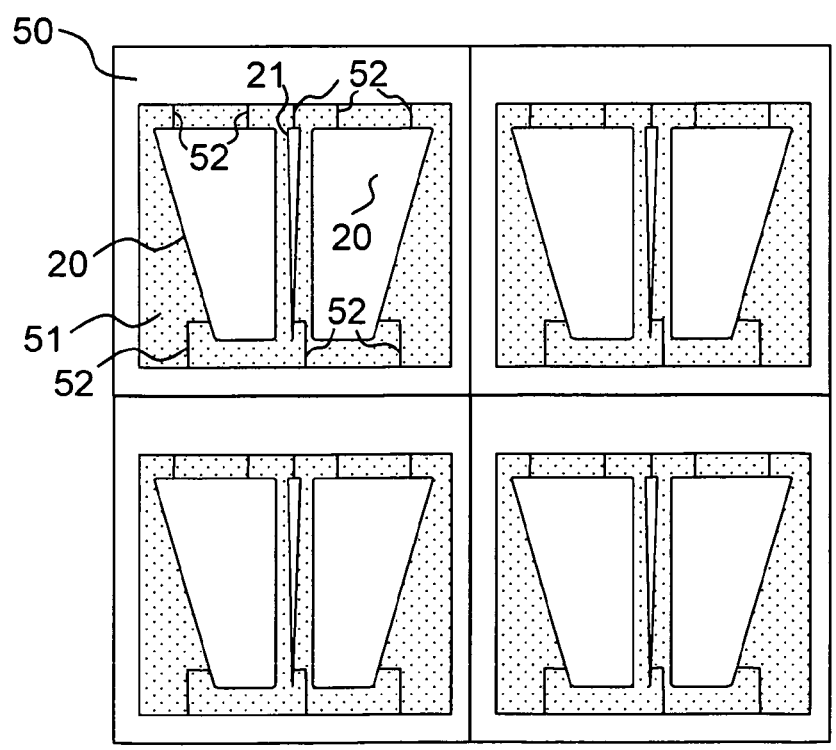
FIG. 5 shows an exemplary embodiment of the manufacture of the test probe according to the invention.

FIG. 5 shows an exemplary embodiment for the manufacture of the test probe 2 according to the invention. The test probe 2 is preferably manufactured during an etching process. The starting point is provided by a sacrificial material 51 to which a thin electrically conductive metallic layer 50 is applied. Following this, a photo-varnish is applied to this metallic layer 50, and the test probe 2 is positioned as a template. In the next step, the sacrificial material 51 together with the template are exposed, for which ultraviolet light is particularly suitable. In a further step, the metallic layer 50 which was not covered by the template during the exposure process is etched away.

FIG. 5 shows the test probe 2 on the sacrificial material 51 after the etching process, before the former is released from the sacrificial material 50 by a further etching process. The structures of the test probe 2 are readily identifiable. The test probe 2 is still connected to the surrounding metallic edge 50 via small webs 52, which are also made from the metal 50. The test probe 2 is detached from the sacrificial material 51 together with the metallic edge 50 and positioned at the corresponding position on the test transformer 4. Following this, the test probe 2 is permanently connected to the test transformer 4. In a final step, the webs 52, which are used to orientate the test probe 2 with high precision, are removed. Very fine structures can be achieved through the etching process, so that the test-signal contact 21 provides an optimum shape. Because of the very small dimensions of the test probe 2, several test probes 2 can be manufactured at the same time on a sacrificial material 51 coated with metal 50. The sacrificial material 51 is preferably a sacrificial wafer, or a sacrificial substrate. It is also possible to use a flexible foil as the sacrificial material 51, from which the test probe 2 is peeled.

Figure 6:
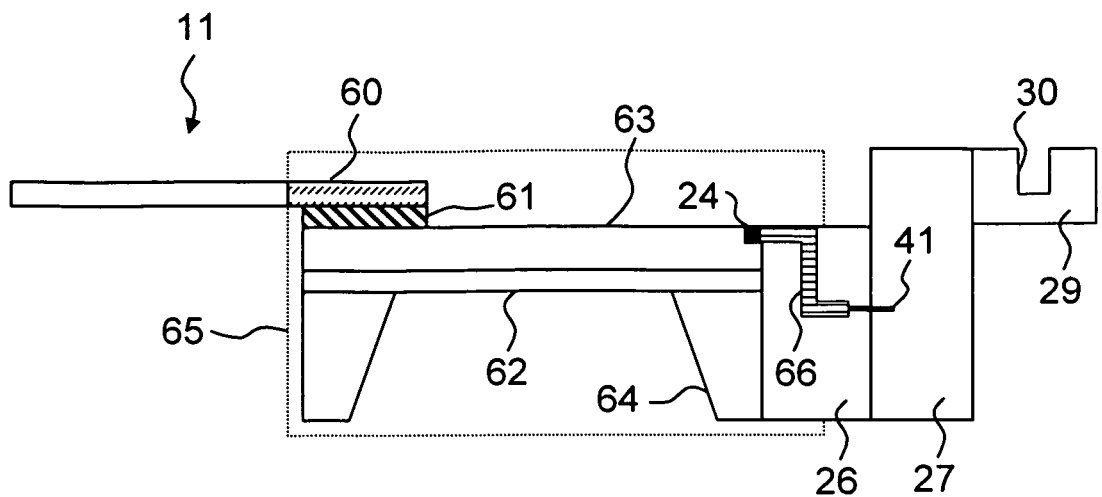
FIG. 6 shows a simplified sectional drawing of an exemplary embodiment of the measuring device according to the invention along the axis I in FIG. 1.

FIG. 6 shows a simplified sectional drawing of the measuring device 11 according to the invention along the axis I.

The test transformer 4 is illustrated in a very simplified manner. It comprises substantially three layers. A frame 64 acts to stabilise the test transformer 4 and represents its basic framework. The frame 64 also represents a defined heat transmission resistance in the direction of the balancing device 27 across the connecting element 26. A first layer 62, which contains inter alia the heating resistors 23, is arranged above the frame 64. A second layer 63, which contains the individual thermoelements 80, is embodied above the first layer 62. A metallisation layer 61 is embodied on a part of the second layer 63. The test probe 2 is arranged on this metallisation layer 61. The test transformer 4 is connected to the test probe 2 to form a test unit 10, for example, by means of thermo-compression. In the thermo-compression process, a high compressive pressure together with a high temperature ensures that a permanent, mechanically stable and, in this case, an electrically conductive connection is formed. The test probe 2 can also be connected to the test transformer 4 to form a test unit 10, for example, by means of wafer bonding or flip-chip bonding. Alongside the separate micro-engineering processes just named, the test probe 2 and the test transformer 4 can also be manufactured to form a test unit 10 in a combined micro-engineering process. In this case, the structure of the test probe 2 is already created on the semiconductor substrate, which is used to accommodate the test transformer 4.

By preference, the test transformer 4 is surrounded by a housing 65, which thermally insulates the test transformer 4 relative to the surroundings. The housing 65 provides openings for the connecting element 26 and the test probe 2. The transition 60 of the test probe 2 to the test transformer 4, which is disposed inside the housing 65, is formed from a material of poor thermal conductivity or is coated so that the temperature of the wafer 1 under investigation does not influence the test results of the test transformer 4.

Inside the connecting element 26, the connecting terminals 24 are electrically connected to the contact plugs 41 via the connection 66. The borehole 30 within the retaining element 29 is also readily visible. In this case, the borehole is embodied as a blind borehole. However, other forms of borehole are conceivable.

Figure 7:
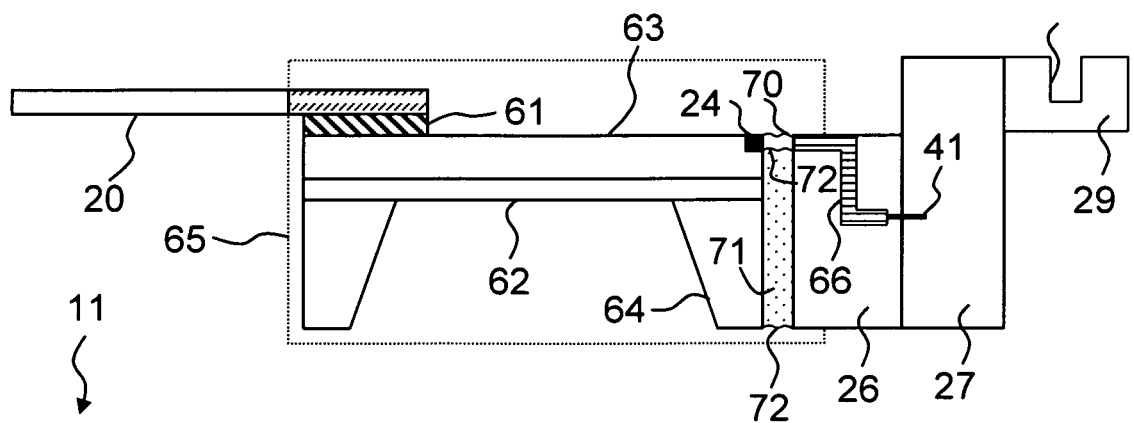
FIG. 7 shows a further simplified sectional view of an exemplary embodiment of the measuring device according to the invention along the axis I with a test unit embodied in an elastic manner.

FIG. 7 shows a simplified sectional drawing along the axis I of a further exemplary embodiment of the measuring device 11 according to the invention. The difference from the exemplary embodiment according to FIG. 6 is that the test transformer 4 is connected in an elastic manner to the connecting element 26. In this context, the connecting element 26 is connected to the connection 66 via a foil cable 70. The gap between the test transformer 4 and the connecting element 26 is filled here with a thermally conductive material 71, which provides, for example, a gel-like and/or elastic and/or paste-like consistency. Elastic seals 72 optionally ensure that this thermally conductive material 71 does not escape.

Figure 8:
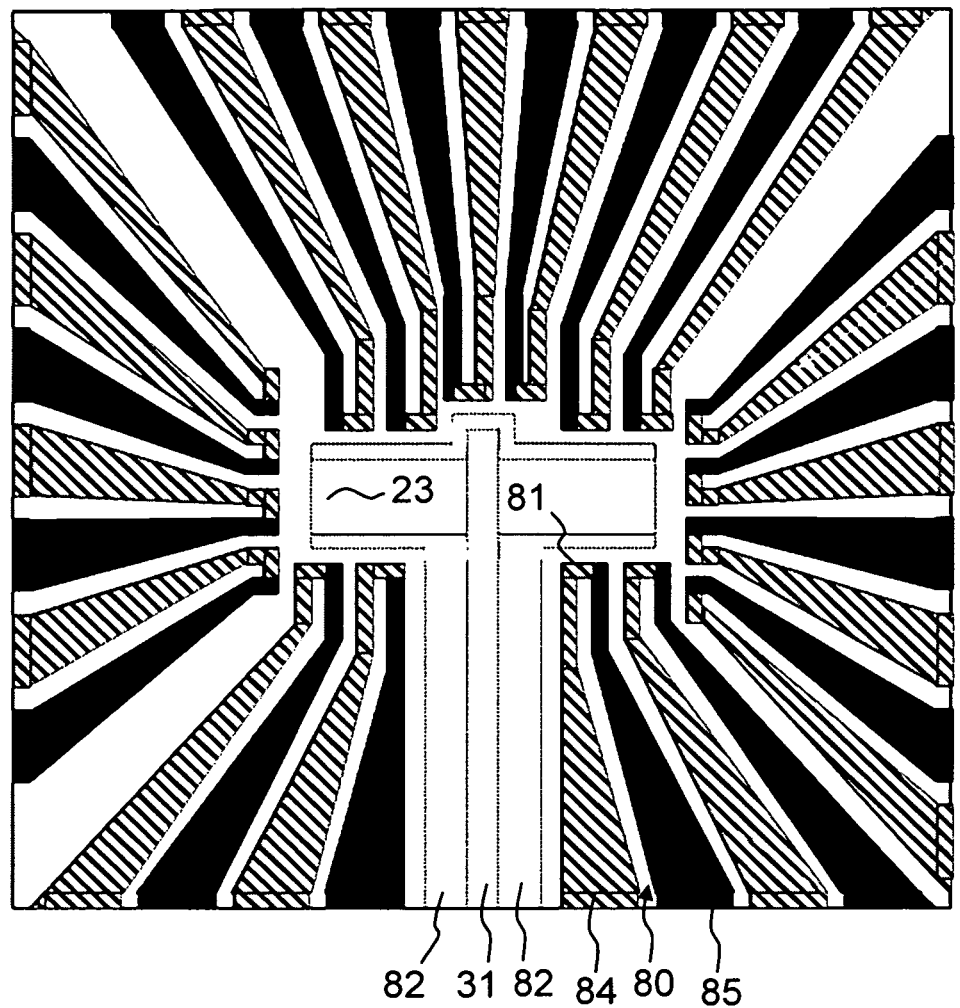
FIG. 8 shows a possible arrangement of the thermoelements in the test transformer.

FIG. 8 shows a plan view of the second layer 63 with the corresponding thermoelements 80. Each thermoelement 80 comprises two different metals or metal alloys, which contact one another at one point. The thermoelements 80 are disposed in their active region 81 with a galvanic separation from one another. Each thermoelement 80 is formed, for example, by a copper-nickel supply line 84, a copper supply line 85 and an active region 81. In this context, the embodiment is not restricted to the named materials. Accordingly, different thermoelements 80 can be connected in series in order to increase the signal level.

Another arrangement of the thermoelements 80 is also possible. Accordingly, the copper-nickel supply line 84 can extend directly above the copper supply line 85. Only an insulating layer separates the two layers from one another with the exception of the active region 81. Accordingly, the occurrence of test loops, in which electromagnetic fields can induce an interference voltage which is superimposed over the thermo-voltage, can be reduced.

The active regions 81 of the thermoelements 80 are arranged close to the heating resistors 23 indicated with dotted shading. The heating resistors 23 are connected to the test-signal contact 21 of the test probe 2 via the stripline 31. The stripline 31 is insulated from the ground surface by the recess 82. Furthermore, the thermoelements 80 are galvanically separated from the layers disposed above and below by insulating layers.

In the event that two test-signal contacts $21_1$, $21_2$ and accordingly two heating resistors $23_1$, $23_2$ operating separately from one another are used, the thermoelements 80 must be connected to one another in such a manner that the heating resistors $23_1$, $23_2$ do not influence the thermoelements 80, which are responsible for measuring the power of the respective, other test signal.

The invention is not restricted to the exemplary embodiment shown. All of the features described and/or illustrated can be combined with one another within the scope of the invention.

The invention is suitable not only for wafer measuring devices but also for testing printed-circuit boards which have already been fitted. Test transformers which operate according to the rectifier principle with diodes can also be used in the measuring device 11.

The invention claimed is:

1. A measuring device comprising:
   at least one test probe and at least one test transformer,
   wherein the at least one test transformer is connected in an electrically conductive manner to the at least one test probe,
   wherein the test transformer is disposed on the test probe to form an inseparable test unit,
   a heat sink in the form of a balancing device, which is mechanically connected to a retaining element in a rigid manner,
   a connecting element, which is connected to the test transformer and to the balancing device, wherein the connecting element includes gold or brass,
   wherein the test probe and the test transformer are jointly replaceable by withdrawing from the measuring device, and
   wherein the test transformer is a thermal power sensor.
2. The measuring device according to claim 1, wherein a test signal is a high-frequency signal.
3. The measuring device according to claim 1, wherein the test transformer outputs an analog, direct voltage, which is proportional to a power of the test signal.
4. The measuring device according to claim 1, wherein the test transformer is thermally insulated from its surroundings by a housing.
5. The measuring device according to claim 1, wherein, at the transition to the test transformer, the test probe is formed from or is coated with a material which prevents the temperature of a wafer under investigation from influencing the test results of the test transformer.
6. The measuring device according to claim 1, wherein the test probe provides at least one test-signal contact and at least one ground contact, which are embodied as independent probes.
7. The measuring device according to claim 6, wherein the at least one test-signal contact and the at least one ground contact of the test probe are embodied as independent probes.
8. The measuring device according to claim 7, wherein the probes for the ground contact are wider than the probes for the test-signal contact and the width of the probes for the test-signal contact is approximately 20 μm, and
wherein the individual probes are embodied to be bent when pressed against a terminal region of a wafer.
9. The measuring device according to claim 1, wherein the test probe provides two test-signal contacts in order optionally to pick up the one test signal differentially or to pick up two different test signals, or
wherein the test probe provides two test-signal contacts and a further ground contact in order optionally to pick up the one test signal differentially or to pick up two different test signals.
10. The measuring device according to claim 9, wherein the two test-signal contacts and the further ground contact of the test probe are embodied as independent probes.
11. The measuring device according to claim 10, wherein the probes for the ground contact are wider than the probes for the test-signal contact and the width of the probes for the test-signal contact is approximately 20 μm, and
wherein the individual probes are embodied to be bent when pressed against a terminal region of a wafer.
12. The measuring device according to claim 1, wherein the test probe and the test transformer are manufactured as a combined test unit in a micro-engineering process.
13. The measuring device according to claim 1, wherein the test probe and the test transformer are manufactured in separate micro-engineering processes and connected to form a test unit by a permanent connection.
14. The measuring device according to claim 13, wherein the test probe and the test transformer are manufactured and connected by wafer-bonding or flip-chip bonding or thermo-compression.
15. The measuring device according to claim 1, wherein the test probe is connected to the test transformer in an elastic manner.
16. The measuring device according to claim 1, wherein the test transformer is connected in an elastic manner to a connecting element.
17. The measuring device according to claim 1, wherein the measuring device provides a connecting element, which contains a plug connection and serves to contact the terminal contacts of the test transformer with the plug connection.
18. The measuring device according to claim 1, wherein the balancing device is formed from gold or brass.

* * * * *